(12) United States Patent
Lee

(10) Patent No.: US 10,445,176 B2
(45) Date of Patent: Oct. 15, 2019

(54) MEMORY SYSTEM, MEMORY DEVICE AND OPERATING METHOD THEREOF

(71) Applicant: SK hynix Inc., Gyeonggi-do (KR)

(72) Inventor: Jeong-Jun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/810,335

(22) Filed: Nov. 13, 2017

(65) Prior Publication Data

US 2018/0293133 A1   Oct. 11, 2018

(30) Foreign Application Priority Data

Apr. 10, 2017   (KR) .................. 10-2017-0045990

(51) Int. Cl.
| G06F 11/10 | (2006.01) |
| G11C 7/10 | (2006.01) |
| G11C 29/52 | (2006.01) |
| G11C 29/04 | (2006.01) |

(52) U.S. Cl.
CPC ...... *G06F 11/1068* (2013.01); *G06F 11/1048* (2013.01); *G11C 7/1009* (2013.01); *G11C 7/1078* (2013.01); *G11C 29/52* (2013.01); *G11C 2029/0411* (2013.01)

(58) Field of Classification Search
CPC .................................................. G06F 11/1076
USPC ........................................ 714/764, 766, 768
See application file for complete search history.

(56) References Cited

U.S. PATENT DOCUMENTS

| 5,448,742 A | * | 9/1995 | Bhattacharya .......... G06F 13/18 370/462 |
| 9,432,298 B1 | * | 8/2016 | Smith .................. H04L 49/9057 |
| 2009/0072856 A1 | * | 3/2009 | Subramaniam ..... G06F 13/1668 326/38 |
| 2014/0317470 A1 | * | 10/2014 | Chung ................ G06F 11/1076 714/764 |
| 2015/0302907 A1 | | 10/2015 | Hadrick et al. |

FOREIGN PATENT DOCUMENTS

| KR | 1020090055199 | 6/2009 |
| KR | 1020140126225 | 10/2014 |

\* cited by examiner

*Primary Examiner* — Fritz Alphonse
(74) *Attorney, Agent, or Firm* — IP & T Group LLP

(57) ABSTRACT

A memory system may include: a controller suitable for transmitting a command, an address and write data, and receiving read data, the command including a write command, a read command and a masked write command; and a memory device suitable for sequentially performing an internal read operation, an internal modification operation and an internal write operation in response to the masked write command while skipping the internal read operation when the masked write commands for the same address are consecutively inputted after the write command is inputted.

20 Claims, 8 Drawing Sheets

MEMORY SYSTEM, MEMORY DEVICE AND OPERATING METHOD THEREOF

CROSS-REFERENCE TO RELATED APPLICATIONS

The present application claims priority of Korean Patent Application No. 10-2017-0045990, filed on Apr. 10, 2017, which is herein incorporated by reference in its entirety.

BACKGROUND

1. Field

This patent document relates to a semiconductor design technology, and more particularly, to a memory device that performs a masked write operation.

2. Description of the Related Art

As the memory devices shrink in size, fail data randomly occur which increase soft errors. Therefore, in order to address such a concern, an on-chip error correction code (ECC) scheme has been recently employed to mount an ECC function in a memory device. That is, in order to secure the yield, the memory device may perform a repair operation of replacing repair target memory cells with redundancy memory cells or may correct an error thereof based on the on-chip ECC scheme.

In order to implement the on-chip ECC scheme, a parity bit for ECC may be allocated and stored into a specific space. In particular, a memory device employing the on-chip ECC scheme may allocate and store a parity bit for ECC into a part of memory cells included in a memory array region.

The memory device may perform a masked write operation of masking a part of the memory array region such that data are not written to the part of the memory array region, during a write operation. The masked write operation retains existing data in a part of the memory array region, in which data are not written, and writes new data to the other part of the memory array region.

In order to perform the masked write operation, the memory device employing the on-chip ECC scheme needs to perform an internal read-modification-write operation which sequentially performs a read operation of reading the existing data from a part of the memory array region, a modification operation of changing parity bits for the existing data and new data through an ECC circuit, and a write operation of writing the new data and the changed parity bit in the other part of the memory array region.

Currently, research is being conducted on a memory device employing an on-chip ECC scheme to perform an efficient masked write operation.

SUMMARY

Various embodiments are directed to a method for efficiently performing a masked write operation in a memory device employing an on-chip ECC scheme.

In an embodiment, a memory system may include: a controller suitable for transmitting a command, an address and write data, and receiving read data, the command including a write command, a read command and a masked write command; and a memory device suitable for sequentially performing an internal read operation, an internal modification operation and an internal write operation in response to the masked write command while skipping the internal read operation when the masked write commands for the same address are consecutively inputted after the write command is inputted.

In an embodiment, a memory device may include: a normal cell region and parity region; an internal command generator suitable for sequentially generating an internal read command and an internal write command when a masked write command is inputted; a masking controller suitable for activating a read blocking signal when the masked write commands for a same address are consecutively inputted after a write command is inputted; a read circuit disabled in response to the read blocking signal, and suitable for reading read data and a read parity bit from the normal cell region and the parity region, respectively, in response to the internal read command; a write circuit suitable for writing masked write data and a write parity bit to the normal cell region and the parity region, respectively, and storing the masked write data and the write parity bit therein, in response to the internal write command; and an error corrector suitable for correcting an error in the read data using the read parity bit, or correcting an error in the masked write data stored in the write circuit using the write parity bit stored in the write circuit, in response to the read blocking signal and the internal read command.

In an embodiment, an operating method for a memory device may include: receiving a masked write command and an address; sequentially generating an internal read command and an internal write command in response to the masked write command; activating a read blocking signal when the masked write commands for the same address are consecutively inputted after a write command is inputted; correcting an error in data previously stored in the memory device using a parity bit previously stored in the memory device in response to the internal read command, when the read blocking signal is activated; receiving masked write data; generating a write parity bit based on the masked write data and the error-corrected data, in response to the internal write command; and writing the masked write data and the write parity bit to memory cells corresponding to the address.

DETAILED DESCRIPTION

Figure 1:
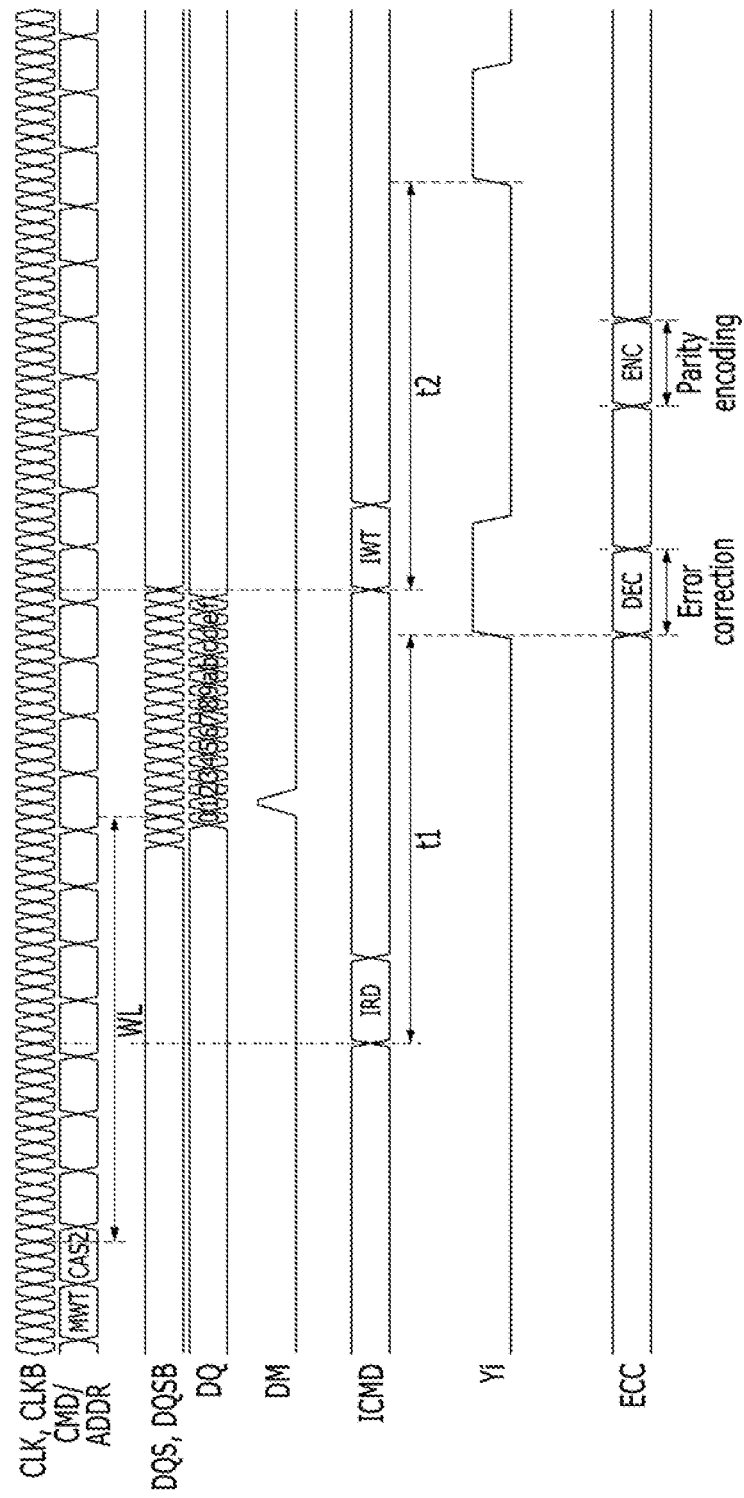
FIG. 1 is a timing diagram for describing a masked write operation of a memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a timing diagram for describing a masked write operation of a memory device.

Referring to FIG. 1, the memory device may receive a masked write command MWT from a memory controller (not illustrated) at a rising or falling edge of a clock CLK, and receive an address signal CAS2 following the masked write command MWT. The address signal CAS2 may correspond to a column address.

The memory device may receive data DQ through a data (DQ) pad after write latency WL from the last rising edge of the clock CLK which is received with the address signal CAS2. Hereafter, the data DQ will be referred to as 'write data'. For example, the write data DQ "0-1-2-3-4-5-6-7-8-9-a-b-c-d-e-f" corresponding to a burst length BL of 16 may be inputted through the DQ pad at rising and falling edges of a data strobe signal DQS.

For reference, the write latency WL of the memory device may indicate a clock cycle delay between the write command WT or masked write command MWT and a first bit of valid write data DQ. In FIG. 1, the write latency WL may be described as a clock cycle delay between the first bit of the valid write data DQ and the last rising edge of the clock CLK which is received with the address signal CAS2 after the write command WT or masked write command MWT and the address signal CAS2 are sequentially inputted.

A data mask signal DM may be inputted at a logic high level in order to mask a specific bit of the write data DQ, for example, a second bit. Thus, the memory device may generate masked write data of which the second bit is masked, according to the data mask signal DM and the write data DQ.

The memory device may sequentially perform an internal read operation, an internal modification operation and an internal write operation in response to the masked write command MWT. For this operation, the memory device may sequentially generate an internal command ICMD such as an internal read command IRD and an internal write command IWT in response to the masked write command MWT.

The internal read command IRD may be generated at a predetermined rising or falling edge of the clock CLK before the write latency WL. For example, the internal read command IRD may be generated at tCCD timing before the write latency WL. The tCCD timing may be defined as a column address strobe (CAS)-to-CAS command delay time.

In response to the internal read command IRD, a column select signal Yi corresponding to the address signal CAS2 inputted from the memory controller may be activated after a predetermined time t1. In response to the activated column select signal Yi, a parity bit and data stored in memory cells of the memory device may be read. Hereafter, the data will be referred to as 'read data'. An ECC circuit provided in the memory device may perform error correction DEC using the read data and parity bit, in response to the internal read command IRD.

The internal write command IWT may be generated at a rising or falling edge of the clock CLK, after the last bit of the write data DQ is inputted through the DQ pad.

In response to the internal write command IWT, the ECC circuit may perform parity encoding ENC to generate parity bits based on the masked write data of which the second bit is masked, and the error-corrected data corresponding to the second bit of the masked write data.

Then, in response to the internal write command IWT, the column select signal Yi coupled to memory cells corresponding to the address signal CAS2 after a predetermined time t2 may be reactivated. Therefore, the masked write data of which the second bit is masked and the parity bit may be stored in memory cells selected by the column select signal Yi.

As described above, since the masked write operation of the memory device includes a read-modification-write operation, current consumption may be increased more than when a normal write operation is performed. Hereafter, a method capable of reducing current consumption during a masked write operation will be described.

Figure 2:
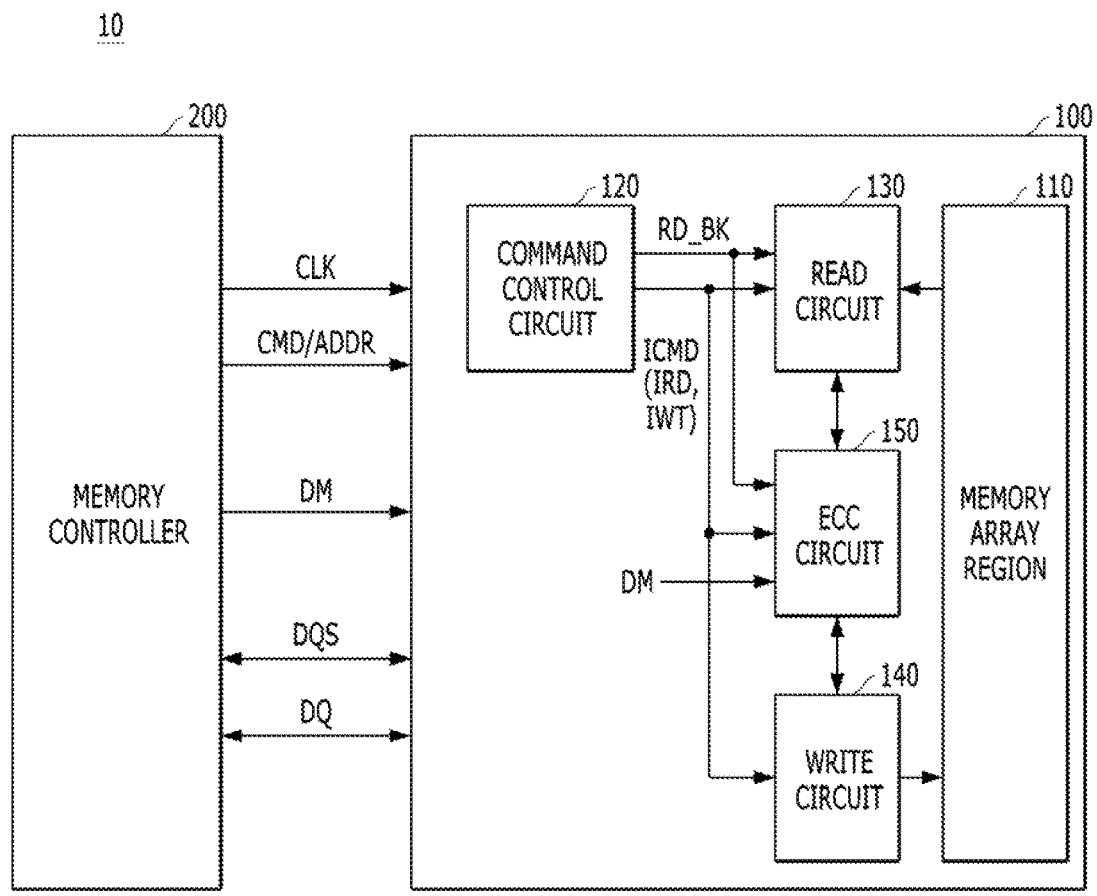
FIG. 2 is a block diagram illustrating a memory system including a memory device in accordance with an embodiment of the present invention.

FIG. 2 is a block diagram illustrating a memory system 10 including a memory device 100 in accordance with an embodiment of the present invention.

Referring to FIG. 2, the memory system 10 may include a memory controller 200 and the memory device 100.

The memory controller 200 may control the memory device 100. The memory controller 200 may transmit control signals, a data strobe signal DQS and data DQ to the memory device 100, and receive the data strobe signal DQS and the data DQ from the memory device 100. The control signals may include a clock CLK, a command CMD, an address ADDR and a data mask signal DM. The command CMD may include a read command RD, a write command WT, a masked write command MWT, and the like. Hereafter, data inputted to the memory device 100 from the memory controller 200 will be referred to as write data DQ, and data outputted to the memory controller 200 from the memory device 100 will be referred to as read data DQ. For reference, the read data DQ may be outputted from memory cells of the memory device 100 after error correction.

The memory device 100 may perform an internal write operation when the command CMD indicates the write command WT, and perform an internal read operation when the command CMD indicates the read command RD. The memory device 100 may sequentially perform an internal read operation, an internal modification operation and an internal write operation when the command CMD indicates the masked write command MWT, and skip the internal read operation when the masked write commands MWT for the same address ADDR are consecutively inputted after the write command WT is inputted. At this time, the internal read operation may include an operation of reading read data and a read parity bit from memory cells corresponding to the address ADDR, the internal modification operation may include an operation of correcting an error of the read data using the read parity bit and generating a write parity bit based on the error-corrected data and write data DQ, and the internal write operation may include an operation of writing the write data DQ and the write parity bit to the memory cells corresponding to the address ADDR. When the internal read operation is skipped in accordance with the present embodiment, the memory device 100 may perform the internal modification operation by correcting an error of data previously stored therein, using a parity bit previously stored therein.

More specifically, the memory device 100 may include a memory array region 110, a command control circuit 120, a read circuit 130, a write circuit 140 and an ECC circuit 150.

The memory array region 110 may include memory cells. For reference, in order to thoroughly describe the present embodiment, FIG. 2 mainly illustrates components which are operated according to the command CMD, and omits components related to a data interface.

The command control circuit 120 may receive the command CMD from the memory controller 200, and generate an internal command ICMD to control an operation of the memory device 100. For example, the command control circuit 120 may receive a read command RD to generate an internal read command IRD. The command control circuit 120 may receive a write command WT to generate an internal write command IWT. The command control circuit 120 may receive a masked write command MWT to sequentially generate the internal read command IRD and the internal write command IWT. The command control circuit 120 may activate a read blocking signal RD_BK when the masked write commands MWT for the same address ADDR are consecutively inputted after the write command WT is inputted. The command control circuit 120 may be implemented by using a logic circuit for performing the above functions.

The read circuit 130 may read a read parity bit and read data from memory cells of the memory array region 110, corresponding to the address ADDR, in response to the internal read command IRD. The read circuit 130 may be disabled in response to the read blocking signal RD_BK. The read circuit 130 may be implemented by using a logic circuit for performing the above functions.

The write circuit 140 may write write data DQ and a write parity bit for the write data DQ to the memory array region 110 in response to the internal write command IWT. The write circuit 140 may be implemented by using a logic circuit for performing the above functions.

The ECC circuit 150 may correct an error of the read data using the read parity data read through the read circuit 130, or correct an error of data stored in the write circuit 140 using a parity bit stored in the write circuit 140, in response to the read blocking signal RD_BK and the internal read command IRD. When the read blocking signal RD_BK is activated, the ECC circuit 150 may correct the error of the data stored in the write circuit 140 using the parity bit stored in the write circuit 140. The ECC circuit 150 may be implemented by using a logic circuit for performing the above functions.

The ECC circuit 150 may generate the write parity bit for the write data DQ transmitted from the memory controller 200, in response to the internal write command IWT. During a masked write operation in which the data mask signal DM is activated, the ECC circuit 150 may generate the write parity bit based on masked write data and error-corrected data, in response to the internal write command IWT. At this time, the masked write data may be generated by masking one or more bits of the write data DQ transmitted from the memory controller 200 according to the data mask signal DM. That is, during the masked write operation, the ECC circuit 150 may generate the write parity bit based on the masked write data and the error-corrected data corresponding to the masked bits of the masked write data, in response to the internal write command IWT.

The memory device 100 having the above-described configuration may operate as follows.

During the internal write operation, in response to the internal write command IWT, the ECC circuit 150 may generate the write parity bit for the write data DQ transmitted from the memory controller 200, and the write circuit 140 may write the write data DQ and the write parity bit in the memory array region 110. At this time, the write circuit 140 may store the write data DQ and the write parity bit therein.

During the internal read operation, in response to the internal read command IRD, the read circuit 130 may read the read parity bit and the read data from the memory array region 110, and the ECC circuit 150 may correct an error of the read data using the read parity bit.

During the masked write operation, when the data mask signal DM and the write data DQ are inputted from the memory controller 200, the memory device 100 may generate masked write data containing one or more masked bits according to the data mask signal DM. The command control circuit 120 may receive the masked write command MWT to sequentially generate the internal read command IRD and the internal write command IWT. When the masked write commands MWT for the same address ADDR are consecutively inputted after the write command WT is inputted, the command control circuit 120 may activate the read blocking signal RD_BK.

When the read block signal RD_BK is deactivated, the read circuit 130 may read the read parity bit and the read data from the memory array region 110, and the ECC circuit 150 may correct an error of the read data using the read parity bit, in response to the internal read command IRD. At this time, the ECC circuit 150 may store the error-corrected data therein. The ECC circuit 150 may generate the write parity bit based on the masked write data and the error-corrected data stored therein, and the write circuit 140 may write the masked write data and the write parity bit in the memory array region 110, in response to the internal write command IWT.

On the other hand, when the read blocking signal RD_BK is activated, the read circuit 130 may be disabled so as not to operate. Instead, the ECC circuit 150 may correct an error of the masked write data stored in the write circuit 140, using the write parity bit stored in the write circuit 140, and store the error-corrected data therein, in response to the internal read command IRD. The ECC circuit 150 may generate the write parity bit based on the masked write data and the error-corrected data stored therein, and the write circuit 140 may write the masked write data and the write parity bit in the memory array region 110, in response to the internal write command IWT. At this time, the write circuit 140 may store the masked write data and the write parity bit therein.

As described above, when masked write commands for the same address are consecutively inputted after a write command is inputted, the memory device in accordance with the present embodiment may disable the read circuit to skip the internal read operation of reading data and a parity bit from the memory array region. Instead, the memory device may perform error correction using the data and parity bit stored in the write circuit, and generate a parity bit based on the error-corrected data. Therefore, the memory device can block the internal read operation following the masked write operation, thereby minimizing the current consumption.

Hereafter, the configuration of the memory device 100 in accordance with the present embodiment will be described in detail with reference to the drawings. The following descriptions will be focused on column-based components related to a data input/output operation.

Figure 3:
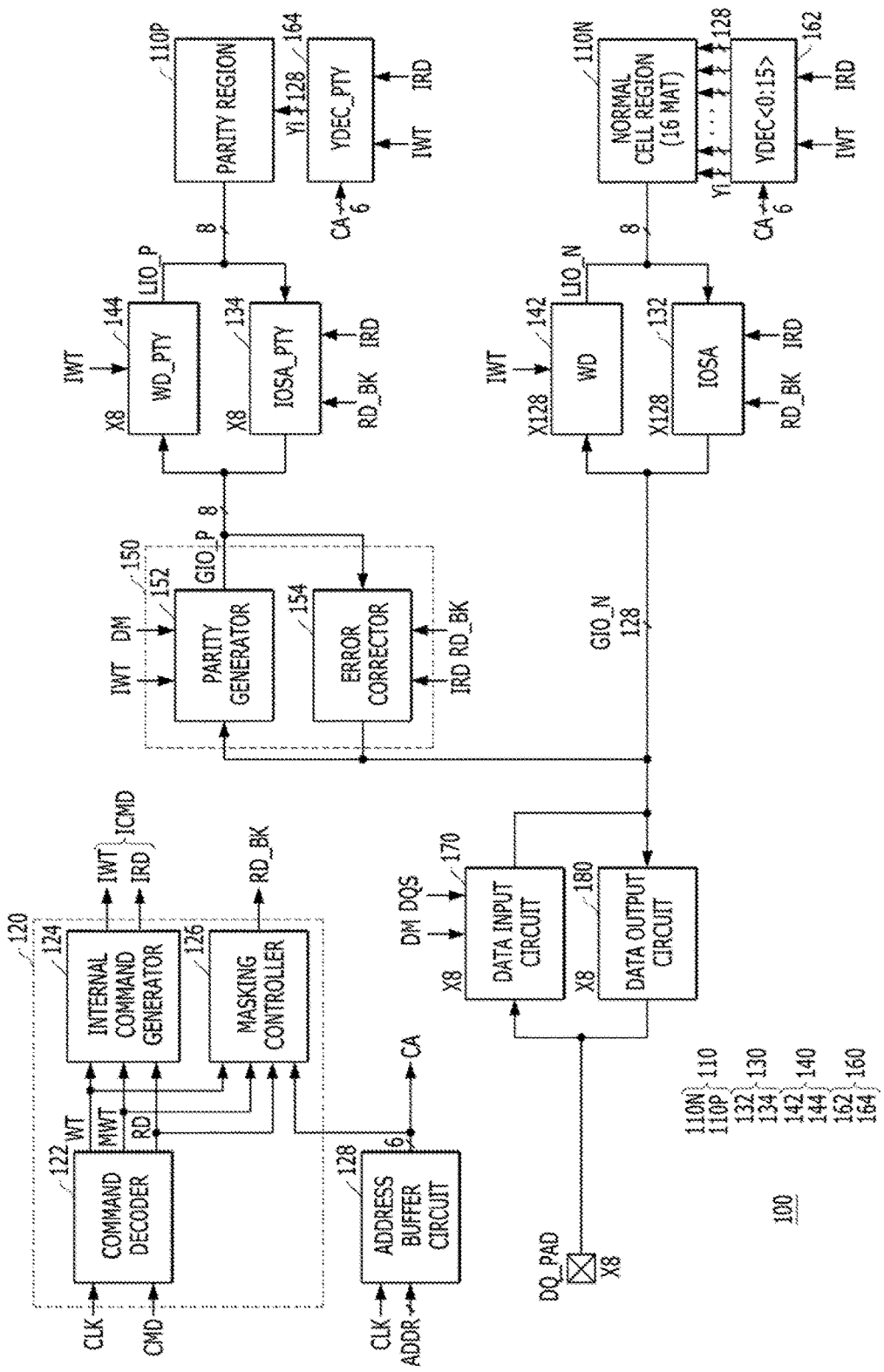
FIG. 3 is a detailed block diagram illustrating the memory device shown in FIG. 2.

FIG. 3 is a detailed block diagram illustrating the memory device 100 shown in FIG. 2. In FIGS. 2 and 3, the same components may be represented by like reference numerals.

Referring to FIG. 3, the memory device 100 may include a plurality of data pads DQ_PAD, a memory array region 110, a command control circuit 120, an address buffer circuit 128, a read circuit 130, a write circuit 140, an ECC circuit 150, a column decoding circuit 160, a plurality of data input circuits 170 and a plurality of data output circuits 180. The ECC circuit 150 may include a parity generator 152 and an error corrector 154.

Data may be inputted to the memory controller (200 of FIG. 2) or outputted from the plurality of data pads DQ_PAD to the memory controller 200. FIG. 3 illustrates only one data pad DQ_PAD, but a plurality of data pads DQ_PAD may be provided. For convenience of description, the present embodiment may be based on the supposition that the memory device 100 includes 8 data pads DQ_PAD. Hereafter, data inputted through the plurality of data pads DQ_PAD may be referred to as write data, and data outputted through the plurality of data pads DQ_PAD may be referred to as read data.

The memory array region 110 may include a normal cell region 110N and a parity region 110P. The normal cell region 110N may store the write data, and the parity region 110P may store a write parity data for correcting an error of the write data.

The address buffer circuit 128 may generate a column address CA by buffering an address ADDR inputted from the memory controller 200. The address buffer circuit 128 may operate in response to a clock CLK. In another embodiment, the memory device may further include an address decoder for generating a row address (not illustrated) and the column address CA by decoding the address ADDR inputted from the memory controller 200.

The command control circuit 120 may include a command decoder 122, an internal command generator 124 and a masking controller 126.

The command decoder 122 may generate a read command RD, a write command WT and a masked write command MWT by decoding the command CMD inputted from the memory controller 200. The command decoder 122 may operate in response to the clock CLK.

The internal command generator 124 may receive the read command RD, the write command WT and the masked write command MWT from the command decoder 122, and generate an internal command ICMD for controlling an operation of the memory device 100. The internal command ICMD may include an internal write command IWT and an internal read command IRD. For example, the internal command generator 124 may receive the read command RD to generate the internal read command IRD, or receive the write command WT to generate the internal write command IWT. Furthermore, the internal command generator 124 may receive the masked write command MWT to sequentially generate the internal read command IRD and the internal write command IWT. At this time, the internal command generator 124 may generate the internal read command IRD at a predetermined rising or falling edge of the clock CLK before the write latency WL, and generate the internal write command IWT after the write data are inputted to the data pad DQ_PAD.

The masking controller 126 may activate a read blocking signal RD_BK when the masked write commands MWT for the same column address CA are consecutively inputted after the write command WT is inputted. For example, the masking controller 126 may activate the read blocking signal RD_BK when the masked write commands MWT for the same column address CA are consecutively inputted after the write command WT or the masked write command MWT is inputted. The masking controller 126 may store the column address CA when the write command WT or the masked write command MWT is inputted, and selectively activate the read blocking signal RD_BK by comparing the stored column address CA to the currently inputted column address CA. The masking controller 126 may reset the stored column address CA when the read command RD is inputted.

The column decoding circuit 160 may include a plurality of normal column decoders (YDEC<0:15>) 162 and a parity column decoder (YDEC_PTY) 164. Under the supposition that the normal cell region 110N includes 16 cell mats and the parity region 110P includes one cell mat, the column decoding circuit 160 may include 16 normal column decoders 162 and one parity column decoder 164.

When the internal write command IWT or the internal read command IRD is activated, the plurality of normal column decoders 162 and the parity column decoder 164 may activate one of a plurality of column select signals Yi by decoding the column address CA. According to the activated column select signal Yi, data may be inputted/outputted between the normal cell region 110N and a normal local data bus LIO_N and between the parity region 110P and a parity local data bus LIO_P.

The plurality of data input circuits 170 may receive the write data inputted to the plurality of data pads DQ_PAD in response to a data strobe signal DQS. The plurality of data input circuits 170 may generate masked write data containing one or more masked bits by masking the write data according to the data mask signal DM transmitted from the memory controller 200 during a masked write operation. The number of data input circuits 170 may correspond to the number of data pads DQ_PAD, for example, 8. During a write operation, consecutive write data may be serially inputted to the respective data pads DQ_PAD. For example, 16 consecutive write data may be inputted to the respective data pads DQ_PAD. Each of the data input circuits 170 may serial-to-parallel convert the write data, and transmit the converted write data to a normal global data bus GIO_N. For example, each of the data input circuits 170 may serial-to-parallel convert the write data at 1:16. When each of 8 data input circuits 170 serial-to-parallel converts the write data at 1:16, 128-bit write data may be loaded in parallel onto the normal global data bus GIO_N.

The ECC circuit 150 may generate a write parity bit based on the write data. The parity generator 152 of the ECC circuit 150 may generate the write parity bit for the 128-bit write data transmitted to the normal global data bus GIO_N, in response to the internal write command IWT, and transmit the write parity bit to the parity global data bus GIO_P. In particular, during the masked write operation, the parity generator 152 may generate the write parity data based on the masked write data and error-corrected data stored in the error corrector 154 of the ECC circuit 150. At this time, the parity generator 152 may receive the data mask signal DM indicating the masked write operation. However, the present embodiment is not limited thereto.

The write circuit 140 may include a plurality of normal write drivers (WD) 142 and a plurality of parity write drivers (WD_PTY) 144. Since the 128-bit write data are loaded in parallel, 128 normal write drivers 142 and 8 parity write drivers 144 may be provided. In the present embodiment, the plurality of normal write drivers 142 and the plurality of parity write drivers 144 may store write-target data therein. That is, the plurality of normal write drivers 142 may store the write data or the masked write data therein as the write-target data, and the plurality of parity write drivers 144 may store the write parity bit therein as the write-target data during the write operation or the masked write operation.

The plurality of normal write drivers 142 may write the write data or masked write data transmitted through the normal global data bus GIO_N, in the normal cell region 110N in response to the internal write command IWT. The data transmission between the plurality of normal write drivers 142 and the normal cell region 110N may be performed through the normal local data bus LIO_N.

The plurality of parity write drivers 144 may write the write parity bit transmitted through the parity global data bus GIO_P, in the parity region 110P in response to the internal write command IWT. The data transmission between the plurality of parity write drivers 144 and the parity region 110P may be performed through the parity local data bus LIO_P.

The read circuit 130 may include a plurality of normal I/O sense amplifiers (IOSA) 132 and a plurality of parity I/O sense amplifiers (IOSA_PTY) 134. Since 128-bit read data are loaded in parallel, 128 normal I/O sense amplifiers 132 and 8 parity I/O sense amplifiers 134 may be provided. In the present embodiment, the plurality of normal I/O sense amplifiers 132 and the plurality of parity I/O sense amplifiers 134 may be disabled in response to the read blocking signal RD_BK.

The plurality of normal I/O sense amplifiers 132 may be disabled in response to the read blocking signal RD_BK, and transmit read data from the normal cell region 110N to the normal global data bus GIO_N in response to the internal read command IRD. The data transmission between the plurality of normal I/O sense amplifiers 132 and the normal cell region 110N may be performed through the normal local data bus LIO_N.

The plurality of parity I/O sense amplifiers 134 may be disabled in response to the read blocking signal RD_BK, and transmit a read parity bit read from the parity region 110P to the parity global data bus GIO_P in response to the internal read command IRD. The data transmission between the plurality of parity I/O sense amplifiers 134 and the parity region 110P may be performed through the parity local data bus LIO_P.

The ECC circuit 150 may correct an error of the read data using the read parity bit. The error corrector 154 of the ECC circuit 150 may correct an error of the read data transmitted through the normal global data bus GIO_N using the read parity bit transmitted through the parity local data bus LIO_P, or correct an error of the masked write data stored in the write circuit 140 using the write parity bit stored in the write circuit 140, in response to the internal read command IRD and the read block signal RD_BK. At this time, the error corrector 154 may store the error-corrected data. For example, when the read blocking signal RD_BK is activated, the error corrector 154 may correct an error of the masked write data stored in the write circuit 140 using the write parity bit stored in the write circuit 140, instead of correcting an error of the read data transmitted through the normal global data bus GIO_N using the read parity bit transmitted through the parity local data bus LIO_P.

The plurality of data output circuits 180 may transmit the error-corrected data from the ECC circuit 150 to the outside of the memory device 100 through the plurality of data pads DQ_PAD. The number of data output circuits 180 may correspond to the number of data pads DQ_PAD. When each of the data output circuits 180 may parallel-to-serial convert the 128-bit read data loaded onto the normal global data bus GIO_N at 16:1, 16-bit read data may be serially outputted to each of 8 data pads DQ_PAD.

Figure 4:
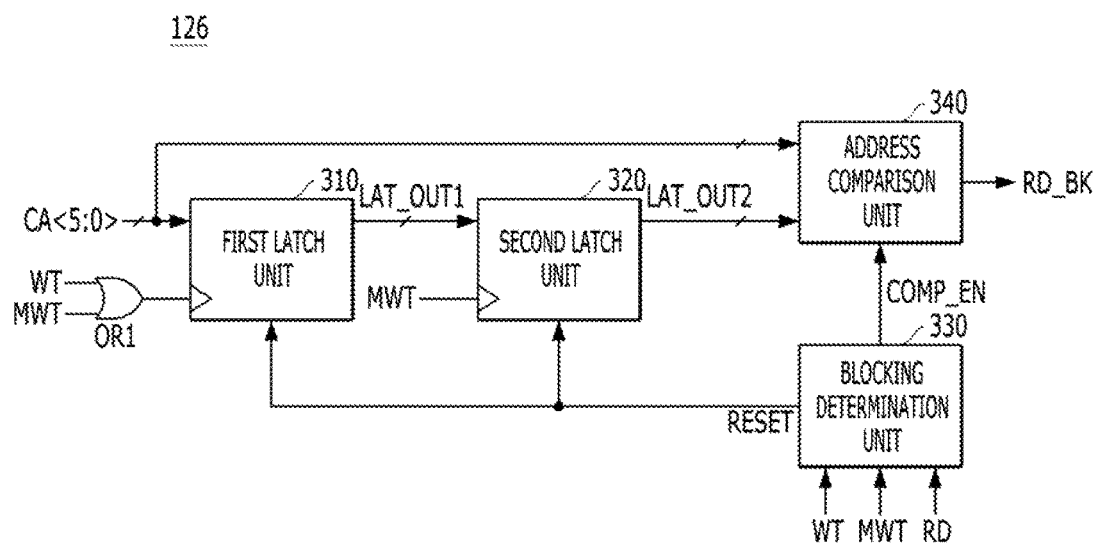
FIG. 4 is a detailed block diagram illustrating a masking controller shown in FIG. 3.

FIG. 4 is a detailed block diagram illustrating the masking controller 126 of FIG. 3. Hereafter, suppose that the column address CA is constituted by six bits CA<5:0>.

Referring to FIG. 4, the masking controller 126 may include a first latch unit 310, a second latch unit 320, a blocking determination unit 330 and an address comparison unit 340.

The first latch unit 310 may store the column address CA<5:0> when the write command WT or the masked write command MWT is inputted. The masking controller 126 may further include a logic gate OR1 which performs an OR operation on the write command WT and the masked write command MWT, and the first latch unit 310 may store the column address CA<5:0> in response to an output of the logic gate OR1.

The second latch unit 320 may store an output LAT_OUT1 of the first latch unit 310 in response to the masked write command MWT.

The blocking determination unit 330 may generate a comparison enable signal COMP_EN according to the write command WT, the masked write command MWT and the read command RD. The blocking determination unit 330 may activate the comparison enable signal COMP_EN when the masked write commands MWT are consecutively inputted after the write command WT or the masked write command MWT is inputted. The blocking determination unit 330 may generate a reset signal RESET for resetting the first and second latch units 310 and 320, when the read command RD is inputted.

The address comparison unit 340 may compare the input column address CA<5:0> with an output LAT_OUT2 of the second latch unit 320 according to the comparison enable signal COMP_EN, and activate the read blocking signal RD_BK depending on a comparison result. The address comparison unit 340 may activate the read blocking signal RD_BK when the input column address CA<5:0> and the output LAT_OUT2 of the second latch unit 320 coincide with each other.

FIGS. 5A to 5D are waveform diagrams for describing an operation of the masking controller 126 of FIG. 4.

Figure 5A:
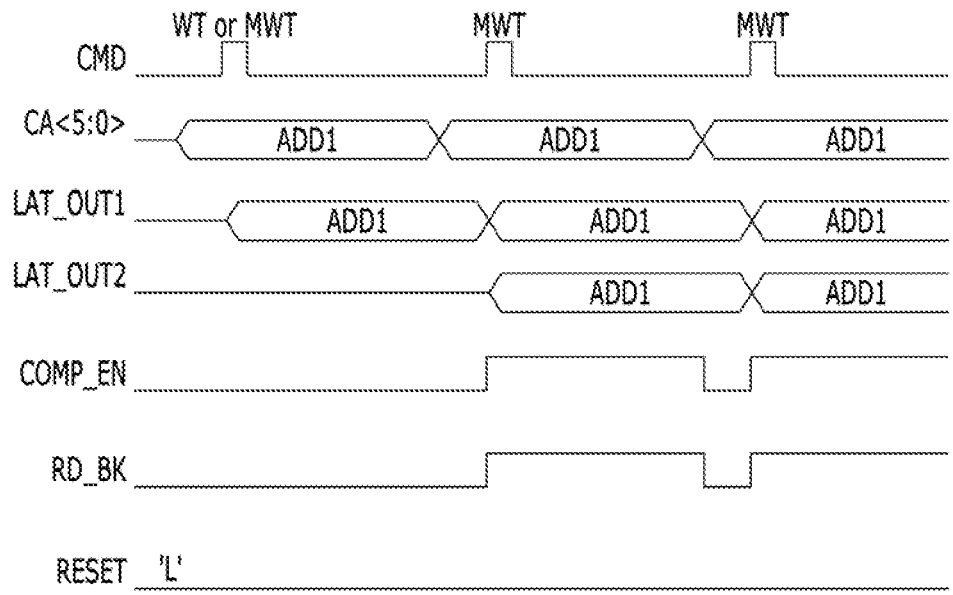
FIGS. 5A to 5D are waveform diagrams for describing an operation of the masking controller shown in FIG. 4.

FIG. 5A illustrates a case in which the masked write commands MWT for the same column address CA are consecutively inputted after the write command WT or the masked write command MWT is inputted.

Referring to FIG. 5A, the column address CA<5:0> of 'ADD1' may be inputted with the write command WT or the masked write command MWT. The first latch unit 310 may store the column address CA<5:0> of 'ADD1'.

Thereafter, the same column address CA<5:0> of 'ADD1' may be inputted with the masked write command MWT. The first latch unit 310 may store the input column address CA<5:0> of 'ADD1', and the second latch unit 320 may store the output LAT_OUT1 of the first latch unit 310, that is, 'ADD1'. The blocking determination unit 330 may determine that the masked write con wands MWT are consecutively inputted after the write command WT or the masked write command MWT is inputted, and activate the comparison enable signal COMP_EN. The address comparison unit 340 may compare the input column address CA<5:0> with the output LAT_OUT2 of the second latch unit 320 according to the comparison enable signal COMP_EN, and activate the read blocking signal RD_BK since the input column address CA<5:0> and the output LAT_OUT2 of the second latch unit 320 coincide with each other.

Thereafter, since the same column address CA<5:0> of 'ADD1' is inputted with the masked write command MWT, the address comparison unit 340 may compare the input column address CA<5:0> with the output LAT_OUT2 of the second latch unit 320 according to the comparison enable signal COMP_EN, and activate the read blocking signal RD_BK.

At this time, since the read command RD is not inputted, the blocking determination unit 330 may deactivate the reset signal RESET.

Figure 5B:
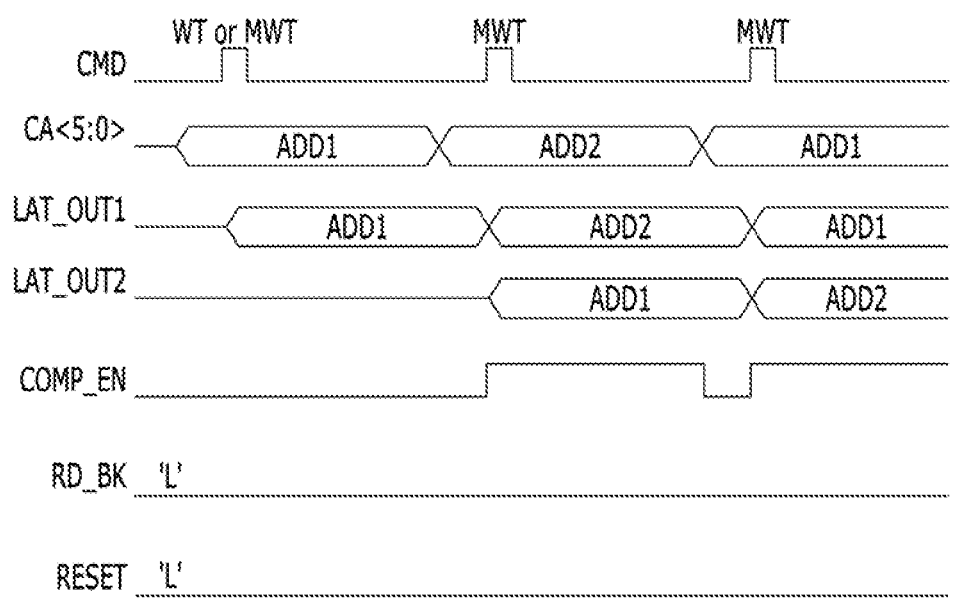

FIG. 5B illustrates a case in which the masked write commands MWT for different column addresses CA are consecutively inputted after the write command WT or the masked write command MWT is inputted.

Referring to FIG. 5B, the column address CA<5:0> of 'ADD1' may be inputted with the write command WT or the masked write command MWT.

Thereafter, the column address CA<5:0> of 'ADD2' different from 'ADD1' may be inputted with the masked write command MWT. At this time, since the masked write commands MWT are consecutively inputted, the blocking determination unit 330 may activate the comparison enable signal COMP_EN. However, since the input column address CA<5:0> of 'ADD2' and the output LAT_OUT2 ('ADD1') of the second latch unit 320 have different values, the address comparison unit 340 may deactivate the read blocking signal RD_BK.

Similarly, the masked write commands MWT may be consecutively inputted. Although the blocking determination unit 330 activates the comparison enable signal COMP_EN, the address comparison unit 340 may deactivate the read blocking signal RD_BK, since the input column address CA<5:0> of 'ADD1' and the output LAT_OUT2 ('ADD2') of the second latch unit 320 have different values.

At this time, since the read command RD is not inputted, the blocking determination unit 330 may deactivate the reset signal RESET.

Figure 5C:
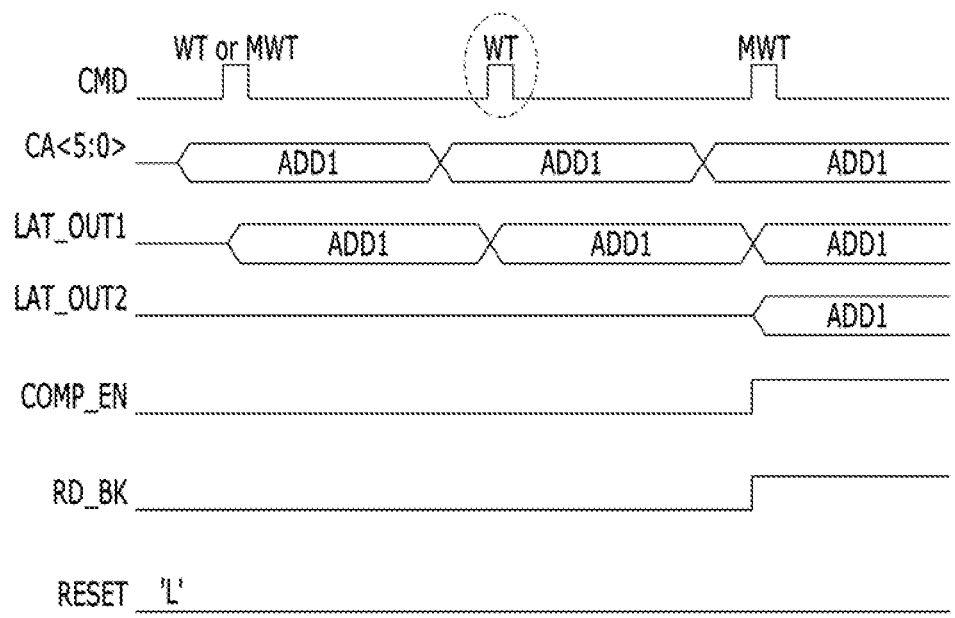

FIG. 5C illustrates a case in which the write commands WT for the same column address CA are consecutively inputted after the write command WT or the masked write command MWT is inputted.

Referring to FIG. 5C, the column address CA<5:0> of 'ADD1' may be inputted with the write command WT or the masked write command MWT.

Thereafter, the same column address CA<5:0> of 'ADD1' may be inputted with the write command WT. At this time, since the masked write commands MWT are not consecutively inputted, the second latch unit 320 may not store the output LAT_OUT1 of the first latch unit 310, and the blocking determination unit 330 may deactivate the comparison enable signal COMP_EN. Thus, the address comparison unit 340 may deactivate the read blocking signal RD_BK.

Thereafter, the same column address CA<5:0> of 'ADD1' may be inputted with the masked write command MWT. At this time, since the masked write commands MWT are consecutively inputted, the blocking determination unit 330 may activate the comparison enable signal COMP_EN. Thus, the address comparison unit 340 may compare the input column address CA<5:0> with the output LAT_OUT2 of the second latch unit 320, and activate the read blocking signal RD_BK.

At this time, since the read command RD is not inputted, the blocking determination unit 330 may deactivate the reset signal RESET.

Figure 5D:
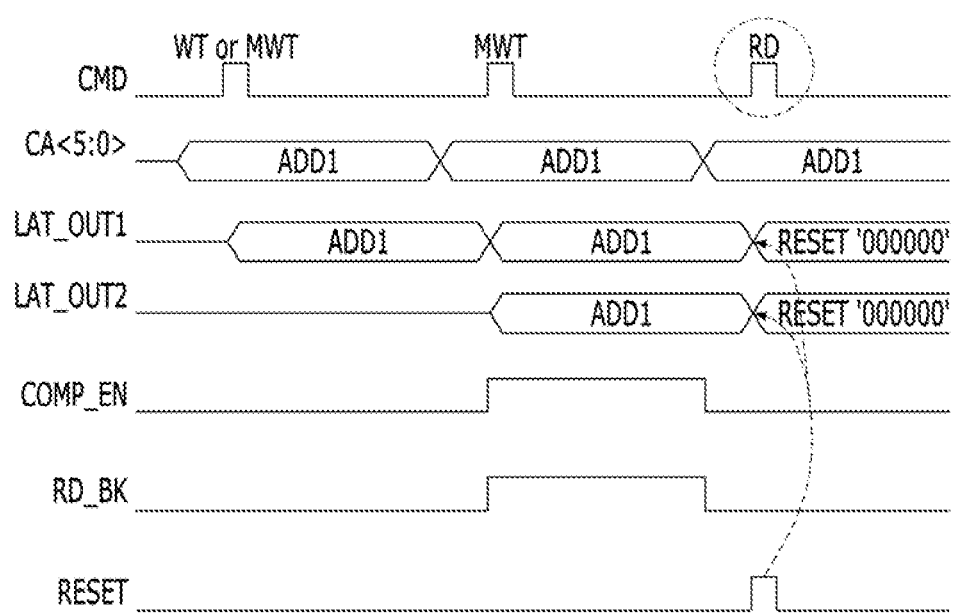

FIG. 5D illustrates a case in which the read command RD for the same column address CA is inputted after the write command WT or the masked write command MWT is inputted.

Referring to FIG. 5D, the column address CA<5:0> of 'ADD1' may be inputted with the write command WT or the masked write command MWT.

Then, the same column address CA<5:0> of 'ADD1' may be inputted with the masked write command MWT. Thus, the blocking determination unit 330 may activate the comparison enable signal COMP_EN, and the address comparison unit 340 may activate the read blocking signal RD_BK.

Thereafter, the same column address CA<5:0> of 'ADD1' may be inputted with the read command RD. At this time, since the masked write commands MWT are not consecutively inputted, the blocking determination unit 330 may deactivate the comparison enable signal COMP_EN. Further, the blocking determination unit 330 may activate the reset signal RESET in response to the read command RD, and the first and second latch units 310 and 320 may be reset in response to the reset signal RESET.

Hereafter, referring to FIGS. 2 to 7, an operation of the memory device in accordance with an embodiment will be described.

Figure 6:
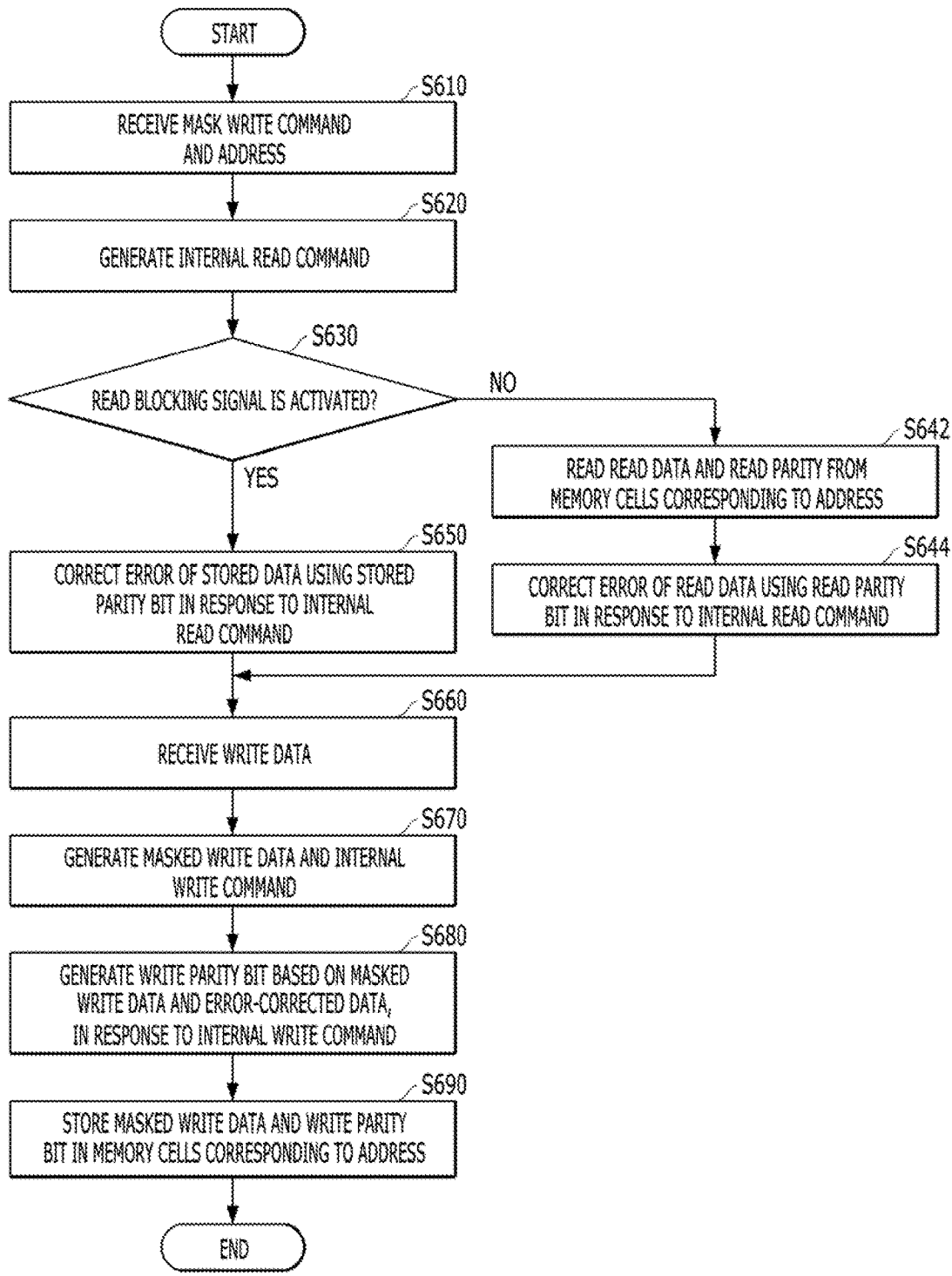
FIG. 6 is a flowchart for describing an operation of a memory device in accordance with an embodiment of the present invention.
Figure 7:
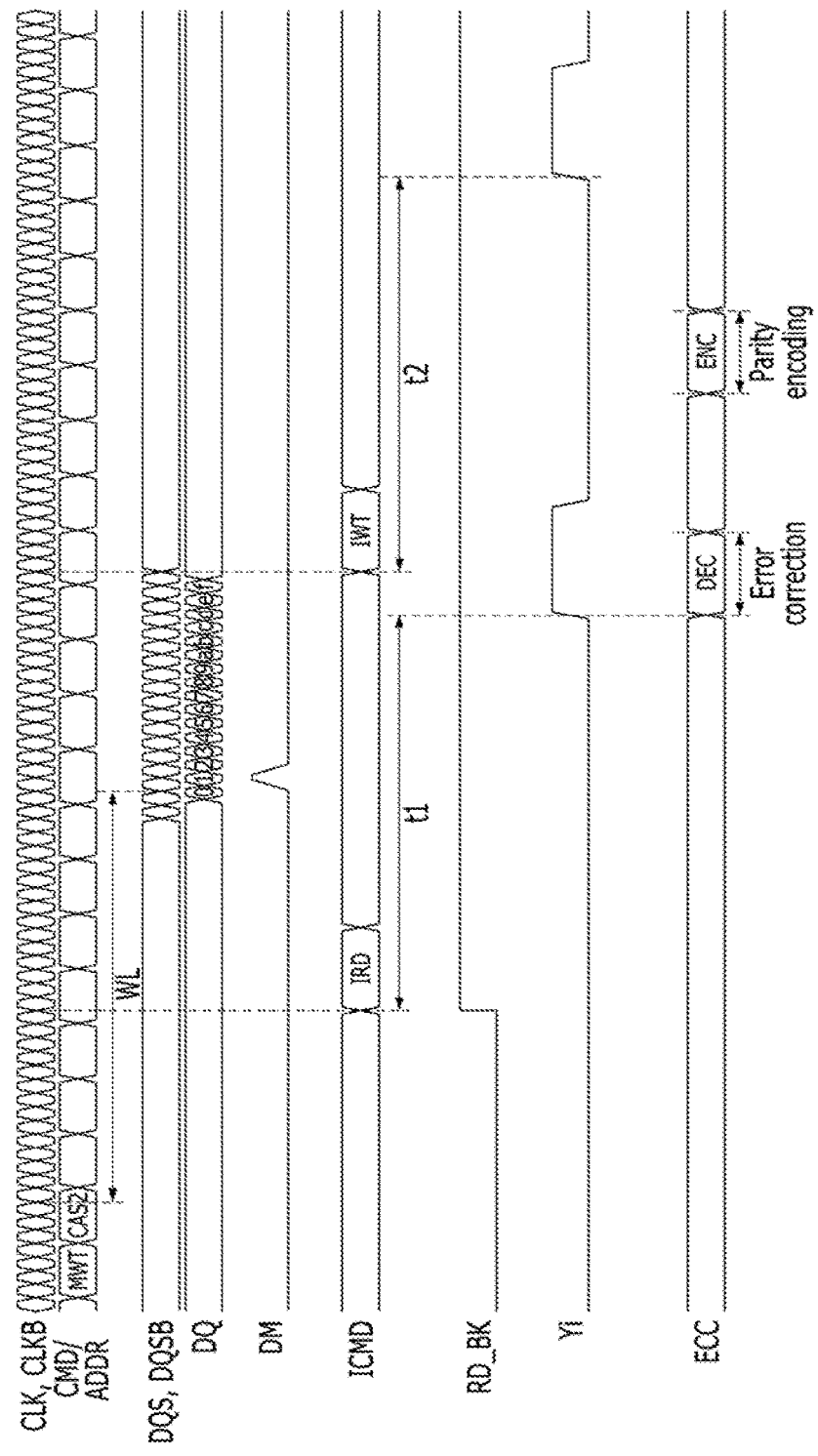
FIG. 7 is a timing diagram for describing the operation of the memory device shown in 6.

FIG. 6 is a flowchart for describing an operation of a memory device in accordance with an embodiment of the present invention. FIG. 7 is a timing diagram for describing the operation of the memory device of FIG. 6.

Referring to FIGS. 6 and 7, the memory device 100 may receive a command CMD indicating a masked write operation, and an address ADDR (CAS2 of FIG. 7) from the memory controller 200 at a rising or falling edge of the clock CLK, at step S610.

The command decoder 122 may generate a masked write command MWT by decoding the command CMD. In response to the masked write command MWT, the internal command generator 124 may generate an internal read command IRD at step S620. At this time, the internal read command IRD may be generated at a predetermined rising or falling edge of the clock CLK before the write latency WL. For example, the internal read command IRD may be generated at tCCD timing before the write latency WL. The tCCD timing may be defined as a CAS-to-CAS command delay time.

The masking controller 126 may generate the read blocking signal RD_BK according to whether the masked write commands MWT for the same column address CA are inputted after the write command WT or the masked write command MWT is inputted, at step S630. Since this process has been described with reference to FIGS. 4 to 5D, the detailed descriptions thereof are omitted herein.

Furthermore, the address buffer circuit 128 may generate a column address CA by buffering the address ADDR. The column decoding circuit 160 may activate a column select signal Yi corresponding to the column address CA after a predetermined time t1, in response to the internal read command IRD. In response to the activated column select signal Yi, data may be read from the normal cell region 110N and transmitted to the normal global data bus GIO_N, and a read parity bit may be read from the parity region 110P and transmitted to the parity global data bus GIO_P.

When the read blocking signal RD_BK is deactivated (NO at S630), the read circuit 130 may be enabled. The read circuit 130 may transmit read data from the normal cell region 110N to the normal global data bus GIO_N in response to the internal read command IRD, and transmit a read parity bit from the parity region 110P to the parity global data bus GIO_P, at step S642. The error corrector 154 of the ECC circuit 150 may perform error correction (DEC of FIG. 7) to correct an error of the read data transmitted through the normal global data bus GIO_N using the read parity bit transmitted through the local global bus LIO_P in response to the internal read command IRD, and store the error-corrected data, at step S644.

On the other hand, when the read blocking signal RD_BK is activated (YES at step S630), the read circuit 130 may be disabled so as not to operate. Instead, the error corrector 154 may perform error correction (DEC of FIG. 7) to correct an error of write data stored in the write circuit 140 using a write parity bit stored in the write circuit 140, and store the error-corrected data therein, in response to the internal read command IRD, at step S650.

The plurality of data input circuits 170 may receive write data from the data pads DQ_PAD, after the write latency WL from the last rising edge of the clock CLK which is received with the address ADDR, at step S660. For example, the write data "0-1-2-3-4-5-6-7-8-9-a-b-c-d-e-f" corresponding to a burst length BL of 16 may be inputted at rising and falling edges of the data strobe signal DQS.

A data mask signal DM may be inputted at a logic high level in order to mask a specific bit of the write data, for example, a second bit. Thus, the data input circuit 170 may generate masked write data of which the second bit is masked, according to the data mask signal DM and the write data, at step S670. Furthermore, the internal command generator 124 may generate the internal write command IWT at a rising edge of the clock CLK, after the last bit of the write data DQ is inputted through the data pad DQ_PAD.

The parity generator 152 of the ECC circuit 150 may perform parity encoding (ENC of FIG. 7) to generate a write parity bit based on the masked write data of which the second bit is masked and the error-corrected data corresponding to the second bit of the masked write data, in response to the internal write command IWT, at step S680.

The column decoding circuit 160 may reactivate the column select signal Yi corresponding to the column address CA after a predetermined time t2, in response to the internal write command IWT. Therefore, the write circuit 140 may store the masked write data and the write parity bit in the normal cell region 110N and the parity region 110P, respectively, at step S690. At this time, the write circuit 140 may store the masked write data and the write parity bit therein.

As described above, the memory device in accordance with the present embodiment may block or skip the internal read operation when the masked write commands for the same address are consecutively inputted after the write command is inputted, during the masked write operation which accompanies the read-modification-write operation. Therefore, the current consumption by the masked write operation can be minimized.

Although various embodiments have been described for illustrative purposes, it will be apparent to those skilled in the art that various changes and modifications may be made without departing from the spirit and scope of the invention as defined in the following claims.

For example, the positions and types of the logic gates and transistors used in the above-described embodiments may be set in different manners according to the polarities of input signals.

What is claimed is:

1. A memory system comprising:
 a controller suitable for transmitting a command, an address and write data, and receiving read data, the command including a write command, a read command and a masked write command; and
 a memory device suitable for sequentially performing an internal read operation, an internal modification operation and an internal write operation in response to the masked write command, wherein the internal read operation is skipped when the masked write commands for the same address are consecutively inputted after the write command is inputted.

2. The memory system of claim 1, wherein the internal read operation comprises an operation of reading the read data and a read parity bit from memory cells corresponding to the address,
 the internal modification operation comprises an operation of correcting an error of the read data using the read parity bit, and generating a write parity bit based on the error-corrected data and the write data, and
 the internal write operation comprises an operation of writing the write data and the write parity bit to the memory cells corresponding to the address.

3. The memory system of claim 2, wherein, when the internal read operation is skipped, the internal modification operation is performed by correcting an error in data previously stored in the memory device, using a parity bit previously stored in the memory device.

4. The memory system of claim 1, wherein the memory device comprises:
 a memory array region comprising memory cells;
 a command control circuit suitable for sequentially generating an internal read command and an internal write command in response to the masked write command, and activating a read blocking signal when the masked write commands for the same address are consecutively inputted after the write command is inputted;
 a read circuit disabled in response to the read blocking signal, and suitable for reading the read data and read parity bit from the memory array region corresponding to the address in response to the internal read command;
 a write circuit suitable for writing the write data and write parity bit to the memory array region in response to the internal write command; and
 an error correction circuit suitable for correcting an error of the read data using the read parity bit, or correcting an error of data stored in the write circuit using a parity bit stored in the write circuit, in response to the read blocking signal and the internal read command.

5. The memory system of claim 4, wherein the error correction circuit generates the write parity bit based on the write data and the error-corrected data, in response to the internal write command.

6. The memory system of claim 4, wherein, when the read blocking signal is activated, the error correction circuit corrects an error in the data stored in the write circuit using the parity bit stored in the write circuit.

7. The memory system of claim 4, wherein the command control circuit comprises:
 an internal command generator suitable for sequentially generating the internal read command and the internal write command when the masked write command is inputted; and
 a masking controller suitable for activating the read blocking signal when the masked write commands for the same address are consecutively inputted after the write command is inputted.

8. The memory system of claim 7, wherein the masking controller stores the address when the write command or the masked write command is inputted, and activates the read blocking signal by comparing the stored address to a currently inputted address according to the masked write command.

9. The memory system of claim 8, wherein the masking controller resets the stored address when the read command is inputted.

10. A memory device comprising:
 a normal cell region and parity region;
 an internal command generator suitable for sequentially generating an internal read command and an internal write command when a masked write command is inputted;

a masking controller suitable for activating a read blocking signal when the masked write commands for a same address are consecutively inputted after a write command is inputted;

a read circuit disabled in response to the read blocking signal, and suitable for reading read data and a read parity bit from the normal cell region and the parity region, respectively, in response to the internal read command;

a write circuit suitable for writing masked write data and a write parity bit to the normal cell region and the parity region, respectively, and storing the masked write data and the write parity bit therein, in response to the internal write command; and an error corrector suitable for correcting an error in the read data using the read parity bit, or correcting an error in the masked write data stored in the write circuit using the write parity bit stored in the write circuit, in response to the read blocking signal and the internal read command.

11. The memory device of claim 10, further comprising:
a data input circuit suitable for generating the masked write data containing one or more masked bits by masking write data according to a data mask signal; and
a parity generator suitable for generating the write parity bit based on the masked write data and the error-corrected data, in response to the internal write command.

12. The memory device of claim 10, wherein the masking controller comprises:
a first latch unit suitable for storing the address when the write command or the masked write command is inputted;
a second latch unit suitable for storing an output of the first latch unit according to the masked write command;
a blocking determination unit suitable for generating a comparison enable signal when the masked write command is inputted after the write command or the masked write command is inputted; and
an address comparison unit suitable for comparing the address with an output of the second latch unit according to the comparison enable signal, and activating the read blocking signal according to a comparison result.

13. The memory device of claim 12, wherein the blocking determination unit generates a reset signal for resetting the first and second latch units when a read command is inputted.

14. An operating method for a memory device, comprising:
receiving a masked write command and an address;
sequentially generating an internal read command and an internal write command in response to the masked write command;

activating a read blocking signal when the masked write commands for the same address are consecutively inputted after a write command is inputted;

correcting an error in data previously stored in the memory device using a parity bit previously stored in the memory device in response to the internal read command, when the read blocking signal is activated;

receiving masked write data;

generating a write parity bit based on the masked write data and the error-corrected data, in response to the internal write command; and writing the masked write data and the write parity bit to memory cells corresponding to the address.

15. The operating method of claim 14, wherein the writing of the masked write data and the write parity bit to the memory cells is performed by a write circuit, and the write circuit stores the masked write data and the write parity bit as the previously stored data and the previously stored parity bit, respectively.

16. The operating method of claim 14, further comprising:
correcting an error of read data from the memory cells corresponding to the address using a read parity data from the memory cells in response to the internal read command, when the read blocking signal is deactivated.

17. The operating method of claim 14, wherein the activating of the read blocking signal comprises:
storing the address which is inputted with the write command or the masked write command;
when a consecutive masked write command is inputted, comparing the stored address with an address inputted with the consecutive masked write command; and
activating the read blocking signal when the addresses coincide with each other.

18. The operating method of claim 17, wherein the activating of the read blocking signal further comprises:
resetting the stored address when a read command is inputted after the write command or the masked write command is inputted.

19. The operating method of claim 14, wherein the receiving of the masked write data comprises:
receiving write data; and
generating the masked write data containing one or more masked bits by masking the write data according to a data mask signal.

20. The operating method of claim 19, wherein the generating of the write parity bit comprises:
generating the write parity bit based on the masked write data and the error-corrected data, in response to the internal write command.

* * * * *